(12) United States Patent
Horikiri et al.

(10) Patent No.: US 11,640,906 B2
(45) Date of Patent: May 2, 2023

(54) CRYSTAL LAMINATE, SEMICONDUCTOR DEVICE AND METHOD FOR MANUFACTURING THE SAME

(71) Applicants: SUMITOMO CHEMICAL COMPANY, LIMITED, Tokyo (JP); HOSEI UNIVERSITY, Tokyo (JP)

(72) Inventors: Fumimasa Horikiri, Hitachi (JP); Takehiro Yoshida, Hitachi (JP); Tomoyoshi Mishima, Tokyo (JP)

(73) Assignees: SUMITOMO CHEMICAL COMPANY, LIMITED, Tokyo (JP); HOSEI UNIVERSITY, Tokyo (JP)

( * ) Notice: Subject to any disclaimer, the term of this patent is extended or adjusted under 35 U.S.C. 154(b) by 617 days.

(21) Appl. No.: 16/617,799

(22) PCT Filed: Apr. 19, 2018

(86) PCT No.: PCT/JP2018/016093
§ 371 (c)(1),
(2) Date: Apr. 1, 2020

(87) PCT Pub. No.: WO2018/221054
PCT Pub. Date: Dec. 6, 2018

(65) Prior Publication Data
US 2020/0227262 A1   Jul. 16, 2020

(30) Foreign Application Priority Data

May 29, 2017 (JP) ............................ JP2017-105756

(51) Int. Cl.
*H01L 21/20* (2006.01)
*C30B 25/20* (2006.01)
(Continued)

(52) U.S. Cl.
CPC .............. *H01L 21/20* (2013.01); *C30B 25/20* (2013.01); *C30B 29/38* (2013.01); *C30B 31/22* (2013.01); *H01L 21/265* (2013.01)

(58) Field of Classification Search
CPC ......... C30B 25/00; C30B 25/20; C30B 29/38; C30B 29/406; C30B 31/22;
(Continued)

(56) References Cited

U.S. PATENT DOCUMENTS

2006/0046331 A1* 3/2006 Kiyama .............. H01L 29/4238
257/E29.136
2007/0128753 A1* 6/2007 Oshima ................. C30B 29/403
438/46
(Continued)

FOREIGN PATENT DOCUMENTS

JP   2006-100801 A   4/2006
JP   2009-246033 A   10/2009
(Continued)

OTHER PUBLICATIONS

Hayashi et al., "Junction Barrier Schottky Diodes with a p⁺-GaN Layer Fabricated on Free-Standing GaN Substrate," The 64th JSAP Spring Meeting (2017), Extended Abstracts (non-official translation), Japan, (Mar. 1, 2017), The Japan Society of Applied Physics.
(Continued)

*Primary Examiner* — Matthew J Song
(74) *Attorney, Agent, or Firm* — Foley & Lardner LLP

(57) ABSTRACT

Provided is a crystal laminate including: a crystal substrate formed from a monocrystal of group III nitride expressed by a compositional formula $In_xAl_yGa_{1-x-y}N$ (where $0 \leq x \leq 1$, $0 \leq y \leq 1$, $0 \leq x+y \leq 1$), the crystal substrate containing at least any one of n-type impurity selected from the group consisting of Si, Ge, and O; and a crystal layer formed by a group III nitride crystal epitaxially grown on a main surface of the
(Continued)

crystal substrate, at least any one of p-type impurity selected from the group consisting of C, Mg, Fe, Be, Zn, V, and Sb being ion-implanted in the crystal layer. The crystal laminate is configured in a manner such that an absorption coefficient of the crystal substrate for light with a wavelength of 2000 nm when the crystal substrate is irradiated with the light falls within a range of 1.8 cm$^{-1}$ or more and 4.6 cm$^{-1}$ or less under a temperature condition of normal temperature.

15 Claims, 6 Drawing Sheets

(51) Int. Cl.
    *C30B 29/38*     (2006.01)
    *C30B 31/22*     (2006.01)
    *H01L 21/265*     (2006.01)

(58) Field of Classification Search
    CPC ........... H01L 21/02389; H01L 21/0254; H01L 21/02576; H01L 21/0262; H01L 21/20; H01L 21/265; H01L 21/26546; H01L 21/2686; H01L 21/3245
    See application file for complete search history.

(56) References Cited

U.S. PATENT DOCUMENTS

| | | | |
|---|---|---|---|
| 2009/0325339 A1 | 12/2009 | Niiyama et al. | |
| 2011/0108852 A1 | 5/2011 | Fujiwara et al. | |
| 2014/0206178 A1 | 7/2014 | Shreter et al. | |
| 2015/0071623 A1* | 3/2015 | Ranish | H05B 3/0047 |
| | | | 392/428 |

FOREIGN PATENT DOCUMENTS

| | | |
|---|---|---|
| JP | 2010-111576 A | 5/2010 |
| JP | 2011-230955 A | 11/2011 |
| JP | 2014-527709 A | 10/2014 |
| JP | 2014-225506 A | 12/2014 |

OTHER PUBLICATIONS

Barker et al., "Infrared Lattice Vibrations and Free-Electron Dispersion in GaN," Physical Review B, vol. 7, No. 2, Jan. 15, 1973, pp. 743-750.

International Searching Authority, "International Search Report," issued in connection with International Patent Application No. PCT/JP2018/016093, dated Jul. 10, 2018.

International Searching Authority, "Written Opinion," issued in connection with International Patent Application No. PCT/JP2018/016093, dated Jul. 10, 2018.

International Preliminary Report on Patentability dated Dec. 3, 2019 for corresponding Application No. PCT/JP2018/016093.

Bentoumi, et al., "Influence of Si doping level on the Raman and IR reflectivity spectra and optical absorption spectrum of GaN," Material & Science Engineering B, 1997, pp. 142-147.

Perlin, et al., "Towards the Identification of the Dominant Donor in GaN," Physical Review Letters, vol. 75, No. 2, Jul. 10, 1995, pp. 296-297.

S. Porowski, "Bulk and homoepitaxial GaN-growth and characterisation," Journal of Crystal Growth (1998) pp. 154-155.

* cited by examiner

CRYSTAL LAMINATE, SEMICONDUCTOR DEVICE AND METHOD FOR MANUFACTURING THE SAME

CROSS-REFERENCE TO RELATED APPLICATIONS

The present application claims priority under 37 U.S.C. § 371 to International Patent Application No. PCT/JP2018/016093, filed Apr. 19, 2018, which claims priority to and the benefit of Japanese Patent Application No. 2017-105756, filed on May 29, 2017. The contents of these applications are hereby incorporated by reference in their entireties.

TECHNICAL FIELD

The present invention relates to a crystal laminate, semiconductor device, and semiconductor device manufacturing method.

BACKGROUND ART

In the production of a semiconductor device such as a light-emitting element or a high-speed transistor, a crystal laminate including a crystal substrate formed from a group III nitride monocrystal and a crystal layer formed as a result of a group III nitride crystal being epitaxially grown on a main surface of the substrate may be used in the process of the production. After an impurity such as Mg is ion-implanted in the crystal layer, annealing (activation annealing) may be carried out for the purpose of repairing crystal damage having occurred in the crystal layer or activating the ion-implanted impurity (see Patent Literature 1).

RELATED ART LITERATURE

Patent Literature

Patent Literature 1: Japanese Patent Application Laid-Open No. 2014-225506

SUMMARY OF INVENTION

Problem to be Solved by Invention

The present invention aims at providing a technique whereby annealing after ion-implantation can be carried out in a short time and with accuracy.

Means for Solving Problem

In an aspect of the present invention, provided is a crystal laminate and related techniques,
the crystal laminate including:
a crystal substrate formed from a monocrystal of group III nitride expressed by a compositional formula $In_xAl_yGa_{1-x-y}N$ (where $0 \leq x \leq 1$, $0 \leq y \leq 1$, $0 \leq x+y \leq 1$), the crystal substrate containing at least any one of n-type impurity selected from the group consisting of Si, Ge, and O; and
a crystal layer formed by a group III nitride crystal epitaxially grown on a main surface of the crystal substrate, at least any one of p-type impurity selected from the group consisting of C, Mg, Fe, Be, Zn, V, and Sb being ion-implanted in the crystal layer,
the crystal laminate being configured in a manner such that an absorption coefficient of the crystal substrate for light with a wavelength of 2000 nm when the crystal substrate is irradiated with the light falls within a range of 1.8 $cm^{-1}$ or more and 4.6 $cm^{-1}$ or less under a temperature condition of normal temperature.

Effect of Invention

According to the present invention, annealing after ion-implantation can be carried out in a short time and with accuracy, and an enhancement in the characteristics of a semiconductor device manufactured as a final product as well as an increase in semiconductor device manufacture yield can be achieved.

DETAILED DESCRIPTION OF INVENTION

Embodiment of Present Invention

1. Configuration of Crystal Laminate 20

Figure 1A:
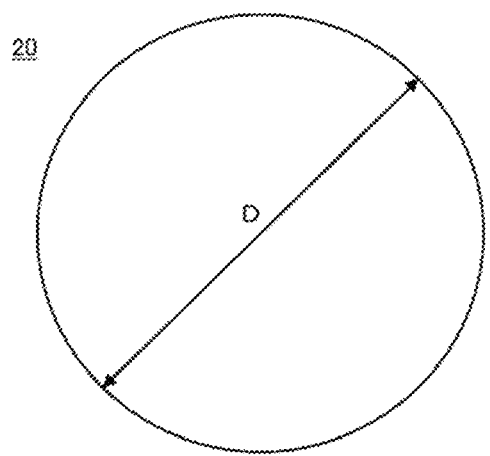
FIG. 1(a) illustrates a plan view of a crystal laminate 20 resulting from a GaN substrate 10 and a crystal layer 11 being laminated on each other.
Figure 1B:
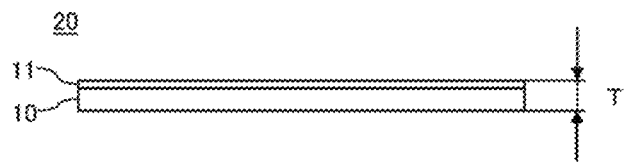
FIG. 1(b) illustrates a cross sectional diagram of the crystal laminate 20.

A crystal laminate (also referred to as "laminate") 20 of this embodiment includes: a crystal substrate (also referred to as "substrate" or "wafer") 10 formed from a monocrystal of GaN (also referred to as "GaN crystal" or "GaN monocrystal") and having a disc shape; and a crystal layer (also referred to as "epi-layer") 11 formed on a main surface of the substrate 10. FIGS. 1(a) and 1(b) illustrate a plan view and a cross section view of the laminate 20, respectively.

The substrate 10 may be used satisfactorily for purposes such as producing a semiconductor device such as a laser diode, LED, high-speed transistor, etc. In this regard, if the diameter D thereof is smaller than 25 mm, semiconductor device productivity is prone to decrease, so it is preferable to set the diameter to 25 mm or more. If the thickness T thereof is below 150 μm, the mechanical strength of the substrate 10 decreases, for example, which makes it difficult to maintain the free-standing state, so the thickness is to be 150 μm or more, preferably around 400 μm, for example. The dislocation density in the main surface of the substrate 10 may be $5\times10^6/cm^2$ or less, for example. Note, however, that the dimensions and the like presented herein are no more than examples, and this embodiment is not limited thereto. The substrate 10 may, for example, be obtained through a process in which hydride vapor phase epitaxy ("HVPE" hereinbelow) is used to epitaxially grow a GaN monocrystal on a seed crystal substrate formed from a GaN monocrystal, and the resulting crystal ingot that has been grown thickly is sliced so that the resultant is self-standing. Alternatively, the substrate 10 may be obtained through a process including: using a GaN layer provided on a different kind of substrate such as a sapphire substrate as a base layer; peeling from the different kind of substrate the crystal ingot obtained by thickly growing a GaN layer by means of a nano-mask, or the like; and removing a facet-grown crystal on the side of the different kind of substrate from the crystal ingot.

The epi-layer 11 may be formed by epitaxially growing a GaN monocrystal on the main surface of the substrate 10. The thickness of the epi-layer 11 may be set to a predetermined thickness within a range of 3 μm or more and 30 μm or less, for example. The n-type impurity concentration in the epi-layer 11 may be lower than the n-type impurity concentration in the substrate 10, for example, and may be set to a predetermined concentration within a range of $1.0\times10^{15}$ at·cm$^{-3}$ or more and $5.0\times10^{16}$ at·cm$^{-3}$ or less, for example. Note, however, that the dimensions and the like presented herein are no more than examples, and this embodiment is not limited thereto. The epi-layer 11 may be grown on the main surface of the substrate 10 by known vapor phase epitaxy such as metal-organic vapor phase epitaxy (hereinbelow, "MOVPE") or HVPE, or known liquid phase epitaxy such as a Na flux method or an ammonothermal method, for example. As will be described later, at least a partial region of the epi-layer 11 is subject to ion-implantation of at least any one of p-type impurity selected from the group consisting of carbon (C), magnesium (Mg), iron (Fe), beryllium (Be), zinc (Zn), vanadium (V), and antimony (Sb). In this description, a planned region of the epi-layer 11 that may be subject to ion-implantation and a region thereof in which ion-implantation has already been performed are collectively referred to as an "ion-implantation region". From the standpoint of controlling the shape of the ion-implantation region and controlling conductive characteristics, it is preferred that the p-type impurity be at least one of Mg and Zn.

The substrate 10 is configured such that the light absorption coefficient thereof when irradiated with light (infrared) with a wavelength of 2000 nm equivalent to the temperature of black body radiation when the temperature is about 1200° C. falls within a range of 1.8 cm$^{-1}$ or more and 4.6 cm$^{-1}$ or less, preferably 2.2 cm$^{-1}$ or more and 3.7 cm$^{-1}$ or less, for example, under a temperature condition of normal temperature, i.e. within a range of 20° C.-30° C. This is because of the substrate 10 containing at least any one of n-type impurity (dopant) selected from the group consisting of silicon (Si), germanium (Ge), and oxygen (O) in a concentration of $1\times10^{18}$ at·cm$^{-3}$ or more and $2.5\times10^{18}$ at·cm$^{-3}$ or less, preferably $1.2\times10^{18}$ at·cm$^{-3}$ or more and $2.0\times10^{18}$ at·cm$^{-3}$ or less, for example. The concentration of free electrons (free carriers) occurring in the substrate 10 as a result of adding the n-type impurity is equivalent to the concentration of the n-type impurity incorporated in the crystal lattice and activated as a donor under the temperature condition of normal temperature, and may be a concentration of $1\times10^{18}$ cm$^{-3}$ or more and $2.5\times10^{18}$ cm$^{-3}$ or less, preferably $1.2\times10^{18}$ cm$^{-3}$ or more and $2.0\times10^{18}$ cm$^{-3}$ or less, for example.

Figure 5:
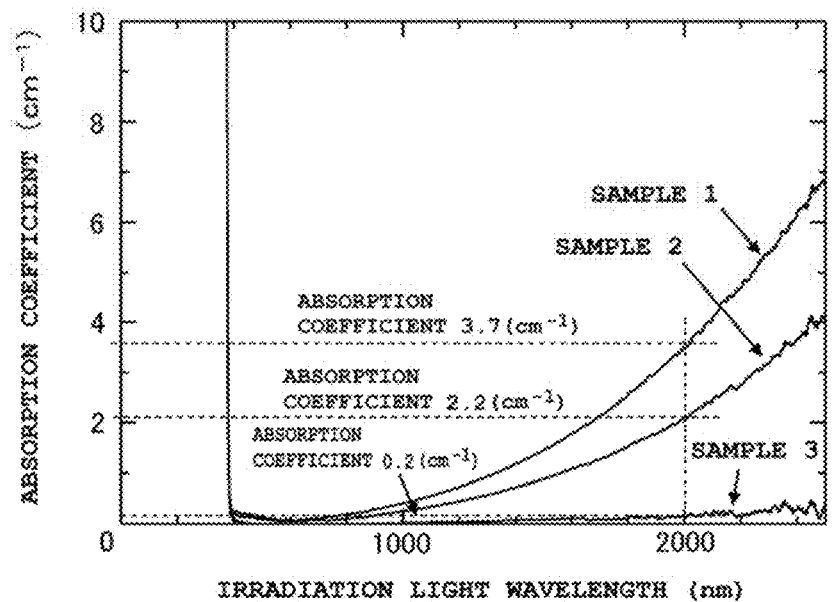
FIG. 5 is a diagram illustrating relationships between light absorption coefficients of GaN crystals and concentration of free carriers existing in the GaN crystals.
Figure 6:
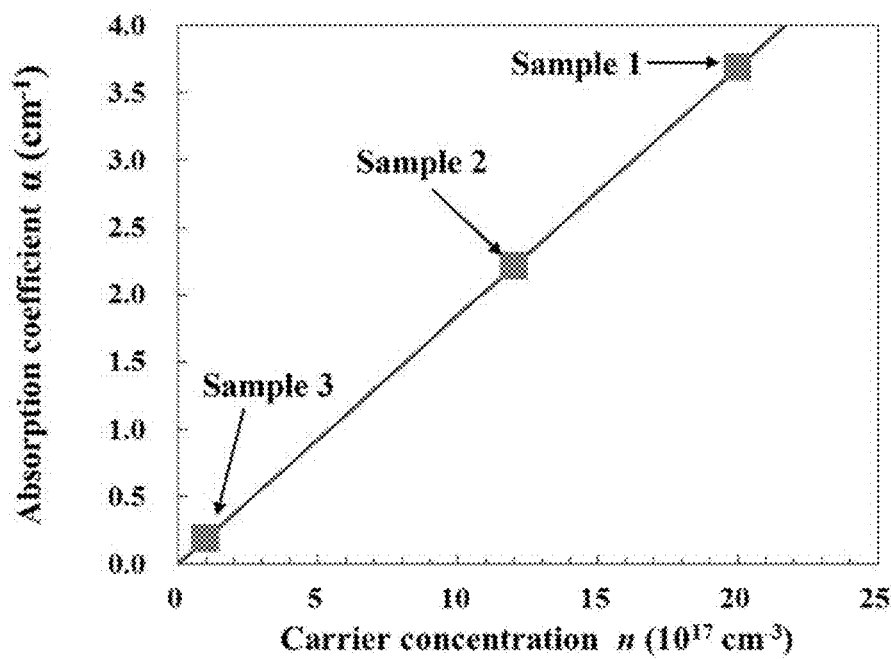
FIG. 6 is a diagram illustrating relations of absorption coefficients at a wavelength of 2000 nm to free electron concentration.

When the GaN crystal having free carriers is irradiated with infrared rays having a wavelength of 700-2500 nm, for example, absorption of the infrared rays by the free carriers (free carrier absorption) occurs, and a resulting increase in kinetic energy, and the like, causes heating of the GaN crystal. The inventors of the present invention produced samples 1-3 in the form of n-type GaN crystals in which Si concentration was adjusted such that the free carrier concentration of the samples under the temperature condition of normal temperature were $2.0\times10^{18}$ cm$^{-3}$, $1.2\times10^{18}$ cm$^{-3}$, and $1.0\times10^{17}$ cm$^{-3}$, respectively, and measured the wavelength dependence of the absorption coefficient for each of the samples. Results thereof are presented in FIG. 5. In FIG. 5, the horizontal axis indicates the wavelength (nm) of irradiation light and the vertical axis indicates the absorption coefficient (cm$^{-1}$) based on free carrier absorption. As can be seen from FIG. 5, it was confirmed that the absorption coefficients when the GaN crystals of samples 1-3 were irradiated with light with a wavelength of 2000 nm were 3.7 cm$^{-1}$, 2.2 cm$^{-1}$, and 0.2 cm$^{-1}$, respectively. FIG. 6 presents the relations of the absorption coefficients at a wavelength of 2000 nm to the free electron concentration in samples 1-3. As can be seen from FIG. 6, it was confirmed that the absorption coefficients when the GaN crystals of samples 1-3 were irradiated with light with a wavelength of 2000 nm were proportional to the free carrier concentration. That is, it was confirmed that with a GaN crystal in which n-type impurity concentration (free carrier concentration) is adjusted as in samples 1 and 2, an absorption coefficient based on free carrier absorption falls within an appropriate range of 1.8 cm$^{-1}$ or more and 4.6 cm$^{-1}$ or less and the GaN crystal can be heated at a practical temperature rising rate through infrared irradiation. In contrast, it was confirmed that with a GaN crystal in which n-type impurity concentration (free carrier concentration) is adjusted as in sample 3, an absorption coefficient based on free carrier absorption is significantly lower than those of samples 1 and 2, and it is difficult to heat the GaN crystal at a practical temperature rising rate through infrared irradiation.

Figure 7:
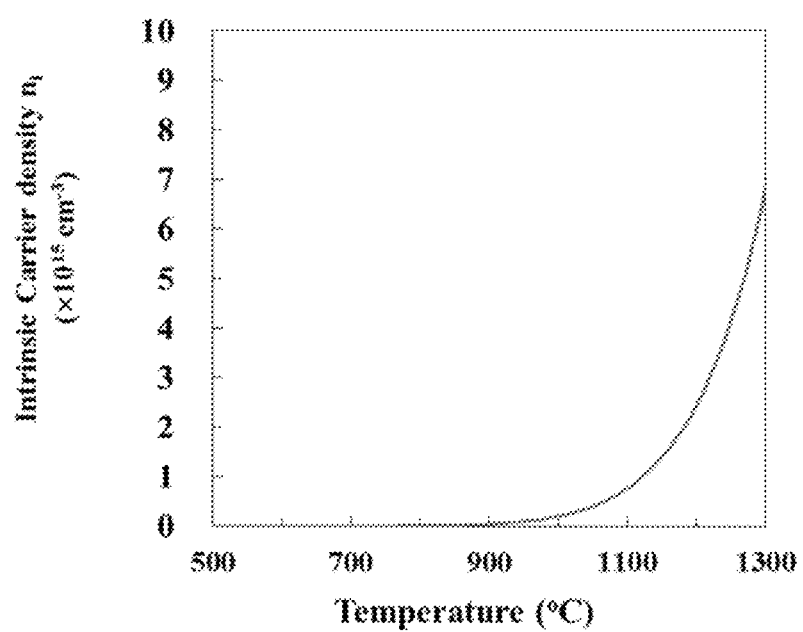
FIG. 7 is a diagram illustrating a relationship between temperature of a non-doped GaN crystal formed as an intrinsic semiconductor and concentration of intrinsic carriers that occur in the GaN crystal.

Even when no impurity is added (doped), intrinsic carriers, i.e. pairs of free electrons and holes, occur in a GaN crystal as an intrinsic semiconductor due to heating-based excitation. The inventors of the present invention also estimated, based on calculation, the density of intrinsic carriers occurring in a GaN crystal as an intrinsic semiconductor. FIG. 7 presents a result thereof. In FIG. 7, the horizontal axis indicates GaN crystal temperature (° C.) and the vertical axis indicates intrinsic carrier density (cm$^{-3}$). According to FIG. 7, it can be confirmed that at least under a temperature condition of 1250° C. or lower, the density of intrinsic carriers occurring in the GaN crystal is lower than $1\times10^{17}$ cm$^{-3}$, that is, lower than the n-type impurity-based free carrier concentration of the GaN crystal of sample 3 above.

From these measurement results, it can be confirmed that with regard to an infrared absorption coefficient of an n-type GaN crystal, at least under a temperature condition of normal temperature or higher and 1250° C. or lower, it is sufficient to take into consideration free carriers that occur due to the addition (doping) of an n-type impurity and there is no need to consider the influence of intrinsic carriers. That is, it was confirmed that the absorption coefficient of the substrate 10 in this embodiment is regulated almost entirely by the amount of n-type impurity added (doped) in the substrate 10 at least under the temperature condition of normal temperature or higher and 1250° C. or lower. In other words, it was confirmed that for keeping the absorption coefficient of the substrate 10 within the aforementioned range, it is crucially important to finely control the amount of n-type impurity added (doped) in the substrate 10.

In order to respond to such requirements, in this embodiment, the concentration of O, which is one from among the n-type impurities that can be used herein (i.e. Si, Ge, and O) and the dosage of which is relatively difficult to control, is reduced to the possible extent, and the total concentration of Si and Ge, the dosage of which is relatively easy to control, is used to regulate the amount of n-type impurities added in the substrate 10. Accordingly, the free carrier concentration in the substrate 10 is made equivalent to the total concentration of Si and Ge. Specifically, while the concentration of 0 added in the substrate 10 is reduced to a magnitude of lower than $1\times10^{17}$ at·cm$^{-3}$, the total concentration of Si and Ge added in the substrate 10 is set to a magnitude of $1\times10^{18}$ at·cm$^{-3}$ or more and $2.5\times10^{18}$ at·cm$^{-3}$ or less. The inventors of the present invention already confirmed that employing the crystal growth technique described later is extremely useful for reducing the 0 concentration as described above. It was confirmed that, according to this technique, the concentration of each of O and carbon (C) added in the substrate 10 can be reduced to a magnitude of lower than $5\times10^{15}$ at·cm$^{-3}$, and moreover, the concentration of each of boron (B) and iron (Fe) can be reduced to a magnitude of lower than $1\times10^{15}$ at·cm$^{-3}$. Further, it was confirmed that, according to this method, the concentration of each of the other elements can also be reduced to a concentration that is below the lower limit of detection for SIMS. Besides, the actual concentration of other impurities than Si and Ge can also be considered to be below $1\times10^{14}$ at·cm$^{-3}$ in view of the fact that the free carrier concentration in the substrate 10 is equivalent to the total concentration of Si and Ge.

2. Semiconductor Device Manufacturing Method

Next, some processes that are carried out as part of the semiconductor device manufacturing process, i.e. processes for manufacturing the substrate 10 and the laminate 20, ion-implantation process, annealing process, and so on, will be described in order.

Configuration of HVPE Apparatus

First, a configuration of an HVPE apparatus (vapor deposition apparatus) 200 used in the manufacture of the substrate 10 will be described in detail with reference to FIG. 2.

The HVPE apparatus 200 includes a reaction vessel (airproof vessel) 203, in the interior of which a deposition chamber (reaction chamber) 201 is formed. An inner cover 204 and a susceptor 208 are provided in the deposition chamber 201. The susceptor 208 is positioned so as to be surrounded by the inner cover 204 and serves as a stand on which a seed crystal substrate (also referred to as a "seed substrate" below) 5 is to be disposed. The susceptor 208 is connected to a rotary shaft 215 of a rotary mechanism 216 and is configured to be capable of rotating in conformity with the driving of the rotary mechanism 216.

One end of the reaction vessel 203 receives the connection of a gas supply pipe 232a for supplying hydrogen chloride (HCl) gas in a gas generator 233a, a gas supply pipe 232b for supplying ammonia (NH$_3$) gas to the inner side of the inner cover 204, a gas supply pipe 232c for supplying doping gas (described later) to the inner side of the inner cover 204, a gas supply pipe 232d for supplying a gas mixture (N$_2$/H$_2$ gas) of nitrogen (N$_2$) gas and hydrogen gas (H$_2$) as purge gas to the inner side of the inner cover 204, and a gas supply pipe 232e for supplying N$_2$ gas as purge gas in the deposition chamber 201. Flow rate control devices 241a-241e and valves 243a-243e are provided on the gas supply pipes 232a-232e, respectively, in the stated order from the upstream side. A gas generator 233a for storing a Ga melt as a raw material is provided downstream of the gas supply pipe 232a. The gas generator 233a is provided with the nozzle 249a for supplying gallium chloride (GaCl) gas, generated through a reaction between HCl gas and the Ga melt, toward, for example, the seed substrate 5 disposed on the susceptor 208. Nozzles 249b, 249c are connected to the downstream side of the gas supply pipes 232b, 232c, respectively, for supplying the various gases supplied from these gas supply pipes toward, for example, the seed substrate 5 disposed on the susceptor 208. The nozzles 249a-249c are disposed so as to flow gas in a direction intersecting the surface of the susceptor 208. The doping gas supplied from the nozzle 249c is a gas mixture of doping raw material gas and a carrier gas such as N$_2$/H$_2$ gas. For the doping gas, in order to limit thermal decomposition of halide gas of the doping raw material, HCl gas may be flown together. For the doping raw material gas included in the doping gas, there may be used, for example, dichlorosilane (SiH$_2$Cl$_2$) gas or silane (SiH$_4$) gas in the case of silicone (Si) dope, or tetrachlorogermane (GeCl$_4$) gas, dichlorogermane (GeH$_2$Cl$_2$) gas, or germane (GeH$_4$) gas in the case of germanium (Ge) dope, but the doping raw material gas is not limited to these.

An evacuation pipe 230 for evacuating the inside of the deposition chamber 201 is provided on the other end of the reaction vessel 203. The evacuation pipe 230 is provided with a pump (or blower) 231. Zone heaters 207a, 207b are provided at the outer periphery of the reaction vessel 203 for heating the inside of the gas generator 233a, the seed substrate 5 on the susceptor 208, and the like, individually for each zone, to a desired temperature. A temperature sensor (not illustrated in the drawings) for measuring the temperature inside the deposition chamber 201 is provided in the reaction vessel 203.

The aforementioned members constituting the HVPE apparatus 200, in particular the members for forming the flow of the various gases, may be configured in the manner described below, for example, so as to enable low impurity concentration crystal growth (described later).

Figure 2:
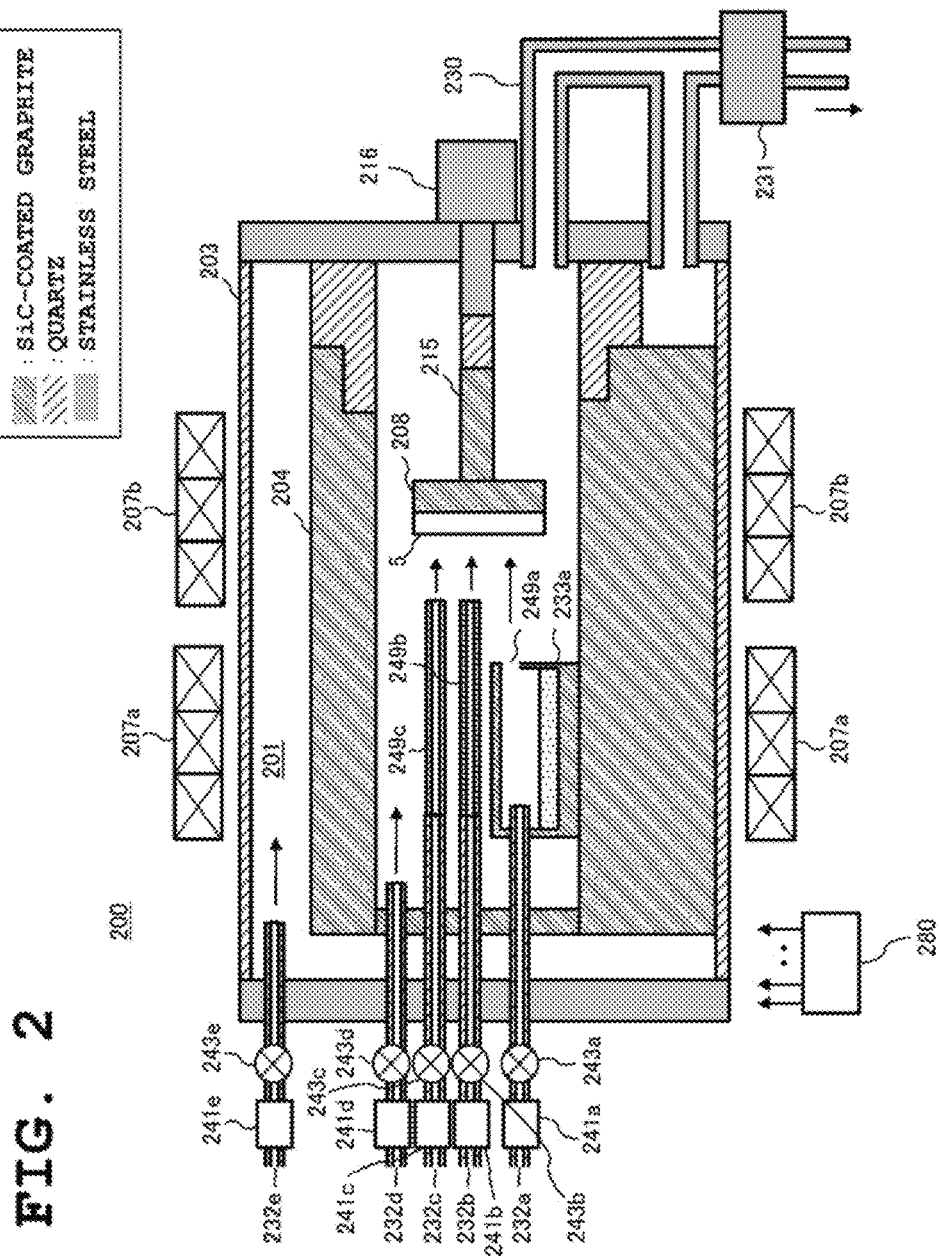
FIG. 2 is a schematic configurational diagram of a vapor deposition apparatus 200.

Specifically, as it is illustrated in FIG. 2 distinguishably according to hatching types, it is preferred that members formed from a material that does not contain quartz and boron be used for members that define a high-temperature region in the reaction vessel 203, the high-temperature region being a region that is heated to a crystal growth temperature (e.g. 1000° C. or higher) by receiving heat radiation from the zone heaters 207a, 207b and that comes into contact with gas being supplied onto the seed substrate 5. Specifically, members formed from silicon carbide (SiC)-coated graphite, for example, may preferably be used for the members defining the high-temperature region. Meanwhile, in regions with relatively low temperatures, it is preferred to form members using high-purity quartz. In other words, in the high-temperature region in which temperature rises relatively high and which comes into contact with HCl gas, and the like, the various members may be formed using SiC-coated graphite without using high-purity quartz. More specifically, the inner cover 204, susceptor 208, rotary shaft 215, gas generator 233a, nozzles 249a-249c, etc. may be formed from SiC-coated graphite. Note that there is no other choice than using quartz for a furnace core tube that is included in the reaction vessel 203, and this is why the inner cover 204 for surrounding the susceptor 208, gas generator 233a, and the like is provided in the deposition chamber 201. Walls of the reaction vessel 203 on both ends thereof, the evacuation pipe 230, and the like may be formed using a metallic material such as stainless steel.

According to "Polyakov et al. J. Appl. Phys. 115, 183706 (2014)", for example, it is disclosed that growth at 950° C. makes it possible to achieve growth of a GaN crystal having low impurity concentration. Such low-temperature growth, however, leads to deterioration in the quality of the obtained crystal, and a GaN crystal having satisfactory thermophysical properties, electrical characteristics, etc. cannot be obtained.

In contrast, in the aforementioned HVPE apparatus 200 in this embodiment, the members in the high-temperature region in which the temperature rises relatively high and which comes into contact with HCl gas, or the like, is formed using SiC-coated graphite; accordingly, even in a temperature range of 1050° C. or above that is suitable for GaN crystal growth, for example, supply of impurities such as Si, O, C, Fe, Cr, Ni, etc. due to quartz, stainless steel, etc. to the crystal growth site can be blocked. As a result, it is possible to achieve growth of a GaN crystal which has high purity and which demonstrates satisfactory characteristics in terms of thermophysical properties and electrical characteristics.

The members included in the HVPE apparatus 200 are connected to a controller 280 formed as a computer and are configured such that a processing procedure and processing conditions therefor (described later) are controlled by a program executed on the controller 280.

Substrate 10 Manufacturing Process

Next, a series of processes in which the aforementioned HVPE apparatus 200 is used to epitaxially grow a GaN monocrystal on the seed substrate 5 and then the grown crystal is sliced so as to obtain the substrate 10 will be described in detail with reference to FIG. 2. Operations of the units forming the HVPE apparatus 200 are controlled by the controller 280 in the description below.

The substrate 10 manufacturing process includes an loading step, a crystal growth step, a unloading step, and a slicing step.

Loading Step

Specifically, first, the throat of the reaction vessel 203 is opened and the seed substrate 5 is placed on the susceptor 208. The seed substrate 5 placed on the susceptor 208 serves as a base (seed) for manufacturing the substrate 10 (described later) and is formed from a monocrystal of GaN, which is an example of a nitride semiconductor, while assuming the shape of a board.

The seed substrate 5 is placed on the susceptor 208 in such a way that the surface of the seed substrate 5 placed on the susceptor 208, i.e. the main surface (crystal growth surface, base surface) thereof on the side facing the nozzles 249a-249c, is the (0001) surface, i.e. +c face (Ga-polar surface), of the GaN crystal.

Crystal Growth Step

In this step, after introduction of the seed substrate 5 into the deposition chamber 201 is completed, the throat is closed, and while heating and evacuating the inside of the deposition chamber 201, supply of either $H_2$ gas or $H_2$ gas plus $N_2$ gas into the deposition chamber 201 is started. Then, in a state in which a desired processing temperature and processing pressure have been reached in the deposition chamber 201 and the atmosphere in the deposition chamber 201 has been made into a desired atmosphere, the supply of HCl gas and $NH_3$ gas from the gas supply pipes 232a, 232b is started and GaCl gas and $NH_3$ gas are supplied onto the surface of the seed substrate 5.

Figure 3A:
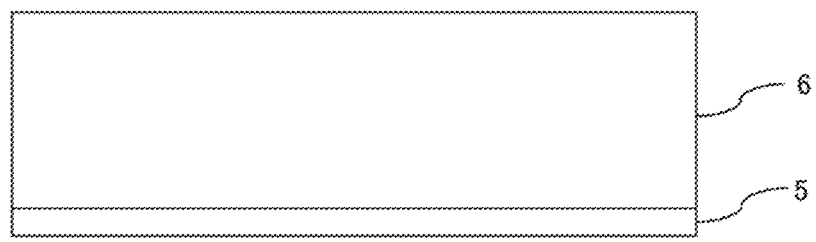
FIG. 3(a) illustrates a diagram illustrating a state in which a GaN crystal film 6 is thickly grown on a seed substrate 5 and FIG. 3(b) a diagram illustrating a state in which a plurality of GaN substrates 10 are obtained as a result of the thickly grown GaN crystal film 6 being sliced.

Accordingly, a GaN crystal is epitaxially grown in the c-axis direction on the surface of the seed substrate 5 and a Gan crystal 6 is formed, as the cross-sectional diagram thereof is illustrated in FIG. 3(a). At this time, by supplying $SiH_2Cl_2$ gas, Si as an n-type impurity can be added in the GaN crystal 6.

In this step, it is preferred that, for the purpose of preventing thermal decomposition of the GaN crystal forming the seed substrate 5, supply of $NH_3$ gas in the deposition chamber 201 be started at or before the time point at which the temperature of the seed substrate 5 reaches 500° C. Moreover, it is preferred that, for the purpose of enhancing uniformity of the GaN crystal 6 in-plane film thickness, or the like, this step be carried out while the susceptor 208 is kept being rotated.

In this step, with regard to the temperatures of the zone heaters 207a, 207b, it is preferred that the temperature of the heater 207a for heating a section in the deposition chamber 201 on the upstream side, encompassing the gas generator 233a, be set to a temperature of 700° C.-900° C., for example, and the temperature of the heater 207b for heating a section in the deposition chamber 201 on the downstream side, encompassing the susceptor 208, be set to a temperature of 1000° C. or higher and 1200° C. or lower, for example. Accordingly, the temperature of the susceptor 208 is adjusted to a predetermined temperature within 1000° C.-1200° C. In this step, an internal heater (not illustrated in the drawings) may be used in an off state, but on condition that the temperature of the susceptor 208 is within the aforementioned range of 1000° C.-1200° C., temperature control using this internal heater may be carried out.

Examples of other processing conditions adopted in this step include the following.

Processing pressure: 0.5-2 atm
GaCl gas partial pressure: 0.1-20 kPa
$NH_3$ gas partial pressure/GaCl gas partial pressure: 1-100
$H_2$ gas partial pressure/GaCl gas partial pressure: 0-100
$SiH_2Cl_2$ gas partial pressure: $2.5 \times 10^{-5}$-$1.0 \times 10^{-4}$ kPa When supplying GaCl gas and $NH_3$ gas onto the surface of the seed substrate 5, $N_2$ gas serving as a carrier gas may be added from each of the gas supply pipes 232a, 232b. By adjusting the blow-out flow velocity of gas supplied from the nozzles 249a, 249b through the addition of $N_2$ gas, it is possible to appropriately control distribution of, for example, the amount of supply of raw material gas on the surface of the seed substrate 5, and even growth speed distribution can be achieved across the entire surface. Instead of $N_2$ gas, a rare gas such as Ar gas or He gas may be added.

Unloading Step

Once the GaN crystal 6 having a desired thickness is grown on the seed substrate 5, then in a state in which the inside of the deposition chamber 201 is evacuated and while $NH_3$ gas and $N_2$ gas are being supplied inside the deposition chamber 201, each of the supply of HCl gas in the gas generator 233a, the supply of $H_2$ gas in the deposition chamber 201, and the heating by the zone heaters 207a, 207b is stopped. Then, when the temperature inside the deposition chamber 201 is lowered to or below 500° C., the supply of NH₃ gas is stopped, and the atmosphere in the deposition chamber 201 is substituted with N₂ gas to return the pressure to atmospheric pressure. Then, the temperature inside the deposition chamber 201 is lowered to a temperature of, for example, 200° C. or lower, i.e. a temperature at which the GaN crystal ingot (i.e. the seed substrate 5 with the GaN crystal 6 formed on the main surface thereof) can be unloaded from the reaction vessel 203. Thereafter, the crystal ingot is unloaded from the deposition chamber 201 to the outside.

Slicing Step

Figure 3B:
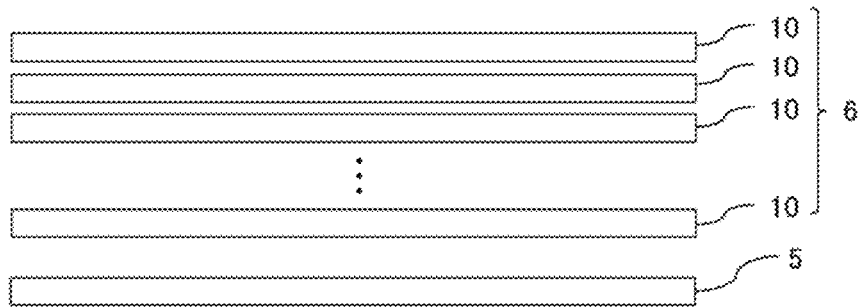

Thereafter, by slicing the unloaded crystal ingot in a direction parallel to the GaN crystal 6 growth surface, for example, one or more substrates 10 can be obtained, as illustrated in FIG. 3(b). The various constituents, properties, etc. of the substrate 10 are as described above, so description thereof will be skipped here. This slicing can be carried out using, for example, a wire saw or an electrical discharge machine. The thickness of the substrate 10 may be set to 250 μm or more, around 400 μm, for example. Thereafter, a predetermined polishing process is carried out on the surface (+c face) of the substrate 10 to make this surface into an epi-ready mirror surface. The reverse surface (−c face) of the substrate 10 is made into a lapped surface of a mirror surface.

Laminate 20 Manufacturing Process

Figure 4A:
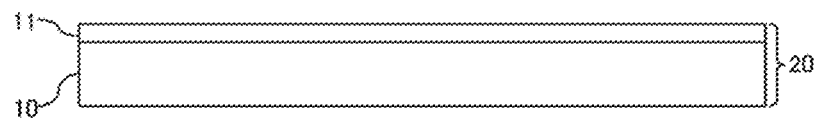
FIG. 4(a) illustrates a diagram illustrating a state in which the crystal laminate 20 has been obtained by growing the crystal layer 11 on a main surface of the GaN substrate 10.
Figure 4B:
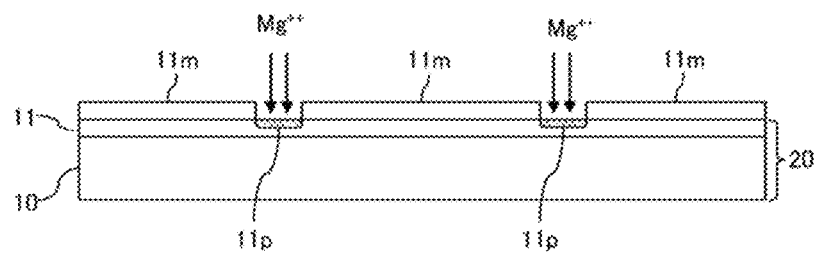
FIG. 4(b) illustrates a diagram illustrating a state in which, after a mask pattern 11m has been formed on a main surface of the crystal layer 11, ion-implantation is performed in an ion-implantation region 11p that is a portion of the crystal layer 11.

After the substrate 10 is produced, then as illustrated in FIG. 4(a), the epi-layer 11 is formed by epitaxially growing a monocrystal of GaN on the main surface of the substrate 10, and the laminate 20 in which the substrate 10 and the epi-layer 11 are laminated is produced. As has been described above, the epi-layer 11 may be formed by known vapor phase epitaxy such as MOVPE or HVPE or known liquid phase epitaxy such as a Na flux method or an ammonothermal method. When HVPE is used, the HVPE apparatus 200 used for producing the substrate 10 may be used to form the epi-layer 11 using the aforementioned crystal growth technique. The thickness of the epi-layer 11 may be set to a thickness within a range of 3 μm or more and 20 μm or less, for example. The epi-layer in this embodiment is formed as a layer which, for example, does not contain n-type impurities such as Si, Ge, O, etc. and p-type impurities such as C, Mg, Fe, Be, Zn, V, Sb, etc., i.e. is formed as a non-doped GaN layer.

Ion-Implantation Process

Once the laminate 20 is produced, then as illustrated in FIG. 4 (b), a known technique such as photolithography is used to form a mask pattern 11m on the main surface of the epi-layer 11. Then, at least any one of p-type impurity selected from the group consisting of C, Mg, Fe, Be, Zn, V, and Sb is implanted in the exposed portion of the epi-layer 11 not being covered by the mask pattern 11m, i.e. ion-implantation region 11p. For the implantation of the p-type impurity, a known ion-implantation technique may be used, as appropriate. The shape and size of the mask pattern 11m, the type, implantation depth, implantation amount, etc. of the p-type impurity and other relevant conditions may be selected, as appropriate, on the basis of the specification of the semiconductor device intended to be produced.

Protection Film 12 Formation Process

Figure 4C:
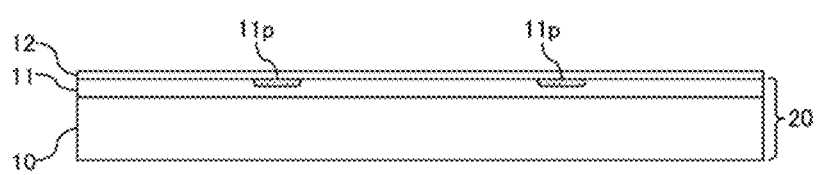
FIG. 4(c) illustrates a diagram illustrating a state in which a protective film 12 is formed on the main surface of the crystal layer 11 after the ion-implantation.

After the ion-implantation is completed, ashing or other known technique is used to remove the mask pattern 11m. Then, chemical vapor deposition (CVD) or other known deposition technique is used to form the protective film 12 which covers in continuous fashion the entire main surface of the epi-layer 11, as illustrated in FIG. 4(c). The protective film 12 may be formed from a silicon nitride film (SiN film) or an aluminum nitride film (AlN film), and the thickness thereof may be a thickness within a range of 20-50 nm, for example.

Annealing Process

After the formation of the protective film 12 is completed, the laminate 20 is introduced into a heating furnace (not illustrated in the drawings) equipped with an infrared heater and an infrared lamp so as to irradiate the laminate 20 with infrared rays and cause the aforementioned free carrier absorption in the substrate 10, thereby heating the laminate 20.

The annealing may be carried out according to a processing procedure and under processing conditions such that, for example, a temperature increase from an initial temperature to an annealing temperature is performed for a period within a range from 3 to 30 seconds, then the annealing temperature is maintained for a period within a range from 20 seconds to 3 minutes, and thereafter a temperature reduction from the annealing temperature to a termination temperature is performed for a period within a range from 1 minute to 10 minutes. The termination temperature and the initial temperature may each be a temperature within a range of 500° C.-800° C., for example. The annealing temperature may be a temperature within a range of 1100° C. or higher and 1250° C. or lower, for example. The atmosphere for the annealing is set to be an inert gas atmosphere formed from N₂ gas, a rare gas, etc., and the pressure thereof may be set to be a pressure within a range of 100-250 kPa, for example.

By carrying out the annealing according to the aforementioned processing procedure and processing conditions, the crystal damage the epi-layer 11 has received due to the ion-implantation can be restored, and moreover, the p-type impurity ion-implanted can be incorporated in the crystal lattice of the epi-layer 11 to activate the impurity as an acceptor.

Figure 4D:
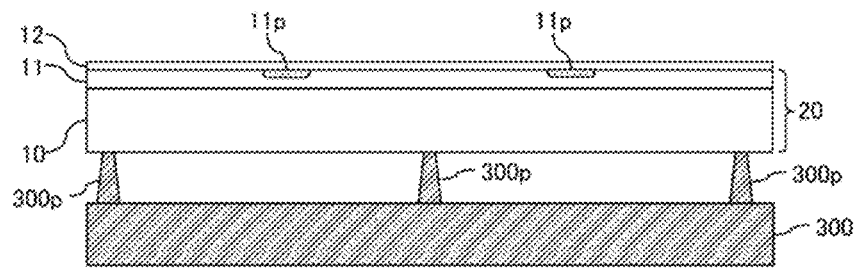
FIG. 4(d) illustrates a diagram illustrating a state in which, while a rear surface side of the crystal laminate 20 is being held at three points, the crystal laminate 20 is irradiated with infrared rays and heated.

It is preferred that this annealing be performed in a state in which, as illustrated in FIG. 4(d), protrusions 300p, for example, a plurality (e.g. three) of which are provided on an upper surface of a retaining plate 300 are used to support a support-receiving surface of the laminate 20 (the surface thereof on the lower side in the drawing) such that the retaining plate 300 and the laminate 20 are separate from each other, i.e. the laminate 20 is uplifted floatingly. In contrast, the heating of the laminate 20 would mainly be the result of the infrared ray-based heat radiation, not the heat transfer from the retaining plate 300. When the heating of the laminate 20 is carried out on the basis of the heat transfer from the retaining plate 300 (or in combination with the heat transfer), then, depending on the state of the rear surface of the laminate 20 and/or the state of the surface of the retaining plate 300, it may be difficult to heat the laminate 20 uniformly over the entire surface thereof. In addition, the laminate 20 may warp as the annealing proceeds so that the state of contact between the laminate 20 and the retaining plate 300 gradually changes, and as a result, the laminate 20 heating condition may become non-uniform over the entire surface thereof. When the laminate 20 is heated mainly on the basis of heat radiation as in this embodiment, such problems can be eliminated. For the purpose of eliminating the influence of the heat transfer, it is preferred that the shape and/or the dimensions of the protrusions 300p be appropriately selected so that the contact area between the protrusions 300p and the laminate 20 be a magnitude of 5% or less of the support-receiving surface of the laminate 20, preferably 3% or less thereof.

Protective Film Removal Process

Figure 4E:
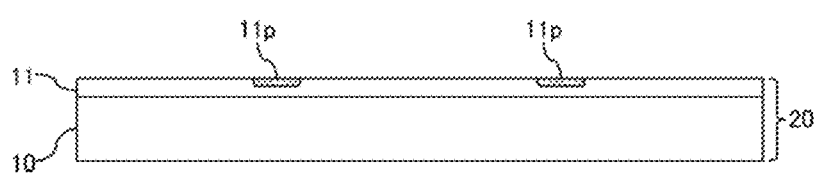
FIG. 4(e) illustrates a diagram illustrating a state in which the protective film 12 has been removed from the crystal laminate 20 having undergone annealing.

Once the annealing is completed, the protective film 12 is removed from the laminate 20 by etching or other such known technique, as illustrated in FIG. 4(e). Thereafter, the laminate 20 undergoes various processing such as crystal growth, photolithography, heating, etching, etc., and the manufacture of the semiconductor device is completed.

3. Effects Obtained According to This Embodiment

One or more of the effects described hereinbelow can be obtained according to this embodiment.

a. Since the absorption coefficient of the substrate 10 with respect to light with a wavelength of 2000 nm under the temperature condition of normal temperature falls within the range of 1.8 cm$^{-1}$ or more and 4.6 cm$^{-1}$ or less, the annealing of the crystal using infrared rays can be carried out in a short time and with accuracy. For example, annealing that involves an increase and reduction in temperature of 500° C.->1250° C.->500° C. can be carried out within a short time of, for example, several tens of seconds to several minutes with accuracy and good reproducibility. As a result, the characteristics of the semiconductor device manufactured through the annealing after the ion-implantation can be enhanced, and manufacture yield of the semiconductor device can be made satisfactory.

When the absorption coefficient under normal temperature is smaller than 1.8 cm$^{-1}$, it may be difficult to carry out the aforementioned increase and reduction in temperature in a short time and with accuracy, and the laminate 20 may be damaged during the annealing. For example, long-time exposure of the laminate 20 under a temperature condition of 1100° C. or higher may result in the elimination of the N (nitrogen) component from the substrate 10 and hence in the difficulty to maintain the conductive characteristics (n-type characteristics) of the substrate 10. Moreover, a prolonged annealing processing duration may result in the migration of the p-type impurity ion-implanted in the epi-layer 11 and hence in the difficulty to control the shape of the ion-implantation region 11p (p-type channel) and control the conductive characteristics. Further, the absorption coefficient under the temperature condition of normal temperature being smaller than 1.8 cm$^{-1}$ means that the amount of n-type impurity in the substrate 10, i.e. the conductive characteristics of the substrate 10, is excessively small, and it may be difficult to use the laminate 20 to produce a semiconductor device having a structure such that a current is applied in the thickness direction thereof, for example. Setting the absorption coefficient under normal temperature to a magnitude of 1.8 cm$^{-1}$ or more, as in this embodiment, makes it possible to solve the aforementioned problems.

The absorption coefficient under normal temperature exceeding 4.6 cm$^{-1}$ means that the amount of n-type impurity in the substrate 10 for achieving this absorption coefficient is larger than 2.5×10$^{18}$ at·cm$^{-3}$ and excessive, and may result in an adverse effect on the crystallinity of the substrate 10, for example. For example, if the concentration of the n-type impurity added in the substrate 10 is excessive, the density of defects in the substrate 10 increases, and thus epitaxial growth on the substrate 10 may be difficult, characteristics of the semiconductor device produced using the laminate 20 may deteriorate, or the life thereof may be shortened. Setting the absorption coefficient of the substrate 10 to a magnitude of 4.6 cm$^{-1}$ or smaller, as in this embodiment, makes it possible to solve the aforementioned problems.

b. As has been described above, with regard to the efficiency of infrared absorption by the substrate 10 formed from the GaN crystal, at least under a temperature condition of normal temperature or higher and 1250° C. or lower, it is sufficient to take into consideration only the free carriers that occur due to the addition (doping) of the n-type impurity in the GaN crystal and there is no need to take the intrinsic carriers into consideration. In other words, the infrared absorption coefficient of the substrate 10, at least under the aforementioned temperature condition, is regulated almost entirely by the amount of n-type impurity added (doped) in the GaN crystal. In this regard, according to this embodiment, processing conditions for carrying out the annealing can be easily designed, and the short annealing can be easily carried out with accuracy and good reproducibility.

c. When manufacturing the substrate 10, the concentration of O, which is one from among the n-type impurities that can be used herein (i.e. Si, Ge, and O) and the dosage of which is relatively difficult to control, is reduced to the possible extent, and the total dosage of Si and Ge, the dosage of which is relatively easy to control, is mainly used to regulate the total amount of n-type impurities added in the substrate 10. Accordingly, the infrared absorption coefficient of the substrate 10 can be kept within the aforementioned range with good reproducibility and accuracy.

Other Embodiments of Present Invention

Specific embodiments of the present invention have been described above, but the present invention is not limited the embodiments described above and may be modified in a variety of ways as long as the spirit of the invention is maintained.

To cite an example, the substrate 10 and the epi-layer 11 may be formed from, not limited to GaN but, aluminum nitride (AlN), aluminum gallium nitride (AlGaN), indium nitride (InN), indium gallium nitride (InGaN), aluminum indium gallium nitride (AlInGaN), or other group III nitride crystal, i.e. a crystal expressed by a compositional formula In$_x$Al$_y$Ga$_{1-x-y}$N (where 0≤x≤1, 0≤y≤1, 0≤x+y≤1). The crystal forming the substrate 10 and the crystal forming the epi-layer 11 may have the same or different compositions.

To cite another example, the n-type impurity added (doped) in the substrate 10 is not limited to Si. That is, the n-type impurity added in the substrate 10 may be Ge, or O, or any combination thereof.

<Preferable Modes of Present Invention>

Preferable modes of the present invention will be appended below.

Appendix 1

In an aspect of the present invention, provided is a crystal laminate including:

a crystal substrate formed from a monocrystal of group III nitride expressed by a compositional formula In$_x$Al$_y$Ga$_{1-x-y}$N (where 0≤x≤1, 0≤y≤1, 0≤x+y≤1), the crystal substrate containing at least any one of n-type impurity selected from the group consisting of Si, Ge, and O; and a crystal layer formed by a group III nitride crystal epitaxially grown on a main surface of the crystal substrate, the crystal layer containing at least any one of p-type impurity selected from the group consisting of C, Mg, Fe, Be, Zn, V, and Sb, the crystal laminate being configured in a manner such that an absorption coefficient of the crystal substrate for light with a wavelength of 2000 nm when the crystal substrate is irradiated with the light falls within a range of 1.8 cm$^{-1}$ or more and 4.6 cm$^{-1}$ or less under a temperature condition of normal temperature.

Appendix 2

Preferably, in the crystal laminate of Appendix 1, density of an intrinsic carrier within the crystal substrate is lower than $1\times10^{17}$ cm$^{-3}$ at least under a temperature condition of normal temperature or higher and 1250° C. or lower.

Appendix 3

Preferably, in the crystal laminate of Appendix 1 or 2, concentration of a free electron occurring within the crystal substrate due to addition of the n-type impurity is $1\times10^{18}$ cm$^{-3}$ or more and $2.5\times10^{18}$ cm$^{-3}$ or less under a temperature condition of normal temperature.

Appendix 4

Preferably, in the crystal laminate of any one of Appendices 1 to 3, concentration of the n-type impurity in the crystal substrate is $1\times10^{18}$ at·cm$^{-3}$ or more and $2.5\times10^{18}$ at·cm$^{-3}$ or less.

Appendix 5

Preferably, in the crystal laminate of any one of appendices 1 to 4, concentration of O in the crystal substrate is $1\times10^{17}$ at·cm$^{-3}$ or less (preferably $5\times10^{15}$ at·cm$^{-3}$ or less) and total concentration of Si and Ge in the crystal substrate is $1\times10^{18}$ at·cm$^{-3}$ or more and $2.5\times10^{18}$ at·cm$^{-3}$ or less.

Appendix 6

In another aspect of the present invention, provided is a semiconductor device including:

a crystal substrate formed from a monocrystal of group III nitride expressed by a compositional formula In$_x$Al$_y$Ga$_{1-x-y}$N (where $0 \le x \le 1$, $0 \le y \le 1$, $0 \le x+y \le 1$), the crystal substrate containing at least any one of n-type impurity selected from the group consisting of Si, Ge, and O; and a crystal layer formed by a group III nitride crystal epitaxially grown on a main surface of the crystal substrate, the crystal layer containing at least any one of p-type impurity selected from the group consisting of C, Mg, Fe, Be, Zn, V, and Sb, the semiconductor device being configured in a manner such that an absorption coefficient of the crystal substrate for light with a wavelength of 2000 nm when the crystal substrate is irradiated with the light falls within a range of 1.8 cm$^{-1}$ or more and 4.6 cm$^{-1}$ or less under a temperature condition of normal temperature.

Appendix 7

In yet another aspect of the present invention, provided is a semiconductor device manufacturing method including:

preparing a crystal laminate including a crystal substrate formed from a monocrystal of group III nitride expressed by a compositional formula In$_x$Al$_y$Ga$_{1-x-y}$N (where $0 \le x \le 1$, $0 \le y \le 1$, $0 \le x+y \le 1$), the crystal substrate containing at least any one of n-type impurity selected from the group consisting of Si, Ge, and O, and a crystal layer formed by a group III nitride crystal epitaxially grown on a main surface of the crystal substrate, an absorption coefficient of the crystal substrate for light with a wavelength of 2000 nm when the crystal substrate is irradiated with the light being 1.8 cm$^{-1}$ or more and 4.6 cm$^{-1}$ or less under a temperature condition of normal temperature;

ion-implanting at least any one of p-type impurity selected from the group consisting of C, Mg, Fe, Be, Zn, V, and Sb in a main surface of the crystal layer; and heating the crystal laminate by irradiating the crystal laminate with an infrared ray.

Appendix 8

The method of Appendix 7, wherein the heating of the crystal laminate is performed in a condition in which a support-receiving surface of the crystal laminate is being supported at three or more locations and the crystal laminate and a retaining plate present on the support-receiving surface side of the crystal laminate are separate from each other.

Appendix 9

The method of Appendix 7 or 8, wherein the preparation of the crystal laminate includes a crystal growth process of loading a seed crystal substrate and a raw material including a group III element in a reaction vessel, and supplying a nitriding agent and a halide of the raw material onto the seed crystal substrate heated to a predetermined crystal growth temperature to grow a crystal of a nitride of the group III element on the seed crystal substrate, and in the crystal growth process, a member formed from a material in which at least a surface of the material does not contain quartz and boron is used as a member defining a high-temperature region, at least, of the reaction vessel, the high-temperature region being a region that is heated to the crystal growth temperature and that comes into contact with gas being supplied onto the seed crystal substrate.

Appendix 10

The method of Appendix 9, wherein preferably, a member formed from silicon carbide-coated graphite is used as the member defining the high-temperature region.

REFERENCE SIGNS LIST

10: substrate (seed substrate)
11: epi-layer (crystal layer)
20: crystal laminate

The invention claimed is:

1. A crystal laminate comprising:

a crystal substrate formed from a monocrystal of group III nitride expressed by a compositional formula In$_x$Al$_y$Ga$_{1-x-y}$N (where $0 \le x \le 1$, $0 \le y \le 1$, $0 \le x+y \le 1$), the crystal substrate containing at least any one of n-type impurity selected from the group consisting of Si, Ge, and O; and a crystal layer formed by a group III nitride crystal epitaxially grown on a main surface of the crystal substrate, the crystal layer containing at least any one of p-type impurity selected from the group consisting of C, Mg, Fe, Be, Zn, V, and Sb, wherein a concentration of B in the crystal substrate is lower than $1\times10^{15}$ at·cm$^{-3}$, and the crystal laminate is configured in a manner such that an absorption coefficient of the crystal substrate for light with a wavelength of 2000 nm when the crystal substrate is irradiated with the light falls within a range of 1.8 cm$^{-1}$ or more and 4.6 cm$^{-1}$ or less under a temperature condition of normal temperature.

2. The crystal laminate of claim 1, wherein density of an intrinsic carrier within the crystal substrate is lower than $1\times10^{17}$ cm$^{-3}$ at least under a temperature condition of normal temperature or higher and 1250° C. or lower.

3. The crystal laminate of claim 2, wherein concentration of a free electron occurring within the crystal substrate due to addition of the n-type impurity is $1\times10^{18}$ cm$^{-3}$ or more and $2.5\times10^{18}$ cm$^{-3}$ or less under a temperature condition of normal temperature.

4. The crystal laminate of claim 2, wherein concentration of the n-type impurity in the crystal substrate is $1\times10^{18}$ at·cm$^{-3}$ or more and $2.5\times10^{18}$ at·cm$^{-3}$ or less.

5. The crystal laminate of claim 2, wherein
concentration of O in the crystal substrate is $1\times10^{17}$ at·cm$^{-3}$ or less and total concentration of Si and Ge in the crystal substrate is $1\times10^{18}$ at·cm$^{-3}$ or more and $2.5\times10^{18}$ at·cm$^{-3}$ or less.

6. The crystal laminate of claim 1, wherein
concentration of a free electron occurring within the crystal substrate due to addition of the n-type impurity is $1\times10^{18}$ cm$^{-3}$ or more and $2.5\times10^{18}$ cm$^{-3}$ or less under a temperature condition of normal temperature.

7. The crystal laminate of claim 6, wherein
concentration of the n-type impurity in the crystal substrate is $1\times10^{18}$ at·cm$^{-3}$ or more and $2.5\times10^{18}$ at·cm$^{-3}$ or less.

8. The crystal laminate of claim 6, wherein
concentration of O in the crystal substrate is $1\times10^{17}$ at·cm$^{-3}$ or less and total concentration of Si and Ge in the crystal substrate is $1\times10^{18}$ at·cm$^{-3}$ or more and $2.5\times10^{18}$ at·cm$^{-3}$ or less.

9. The crystal laminate of claim 1, wherein
concentration of the n-type impurity in the crystal substrate is $1\times10^{18}$ at·cm$^{-3}$ or more and $2.5\times10^{18}$ at·cm$^{-3}$ or less.

10. The crystal laminate of claim 9, wherein
concentration of O in the crystal substrate is $1\times10^{17}$ at·cm$^{-3}$ or less and total concentration of Si and Ge in the crystal substrate is $1\times10^{18}$ at·cm$^{-3}$ or more and $2.5\times10^{18}$ at·cm$^{-3}$ or less.

11. The crystal laminate of claim 1, wherein
concentration of O in the crystal substrate is $1\times10^{17}$ at·cm$^{-3}$ or less and total concentration of Si and Ge in the crystal substrate is $1\times10^{18}$ at·cm$^{-3}$ or more and $2.5\times10^{18}$ at·cm$^{-3}$ or less.

12. A semiconductor device comprising:
a crystal substrate formed from a monocrystal of group III nitride expressed by a compositional formula $In_xAl_yGa_{1-x-y}N$ (where $0\leq x\leq1$, $0\leq y\leq1$, $0\leq x+y\leq1$), the crystal substrate containing at least any one of n-type impurity selected from the group consisting of Si, Ge, and O; and
a crystal layer formed by a group III nitride crystal epitaxially grown on a main surface of the crystal substrate, the crystal layer containing at least any one of p-type impurity selected from the group consisting of C, Mg, Fe, Be, Zn, V, and Sb, wherein a concentration of B in the crystal substrate is lower than $1\times10^{15}$ at·cm$^{-3}$, and
the semiconductor device is configured in a manner such that an absorption coefficient of the crystal substrate for light with a wavelength of 2000 nm when the crystal substrate is irradiated with the light falls within a range of 1.8 cm$^{-1}$ or more and 4.6 cm$^{-1}$ or less under a temperature condition of normal temperature.

13. A semiconductor device manufacturing method comprising:
preparing a crystal laminate comprising a crystal substrate formed from a monocrystal of group III nitride expressed by a compositional formula $In_xAl_yGa_{1-x-y}N$ (where $0\leq x\leq1$, $0\leq y\leq1$, $0\leq x+y\leq1$), the crystal substrate containing at least any one of n-type impurity selected from the group consisting of Si, Ge, and O, and a crystal layer formed by a group III nitride crystal epitaxially grown on a main surface of the crystal substrate, wherein a concentration of B in the crystal substate is lower than $1+10^{15}$ at·cm$^{-3}$, and an absorption coefficient of the crystal substrate for light with a wavelength of 2000 nm when the crystal substrate is irradiated with the light is 1.8 cm$^{-1}$ or more and 4.6 cm$^{-1}$ or less under a temperature condition of normal temperature;
ion-implanting at least any one of p-type impurity selected from the group consisting of C, Mg, Fe, Be, Zn, V, and Sb in a main surface of the crystal layer; and
heating the crystal laminate by irradiating the crystal laminate with an infrared ray.

14. The semiconductor device manufacturing method of claim 13, wherein
the heating of the crystal laminate is performed in a condition in which a support-receiving surface of the crystal laminate is being supported at three or more locations and the crystal laminate and a retaining plate present on the support-receiving surface side of the crystal laminate are separate from each other.

15. The semiconductor device manufacturing method of claim 13, wherein
the preparation of the crystal laminate includes a crystal growth process of loading a seed crystal substrate and a raw material including a group III element in a reaction vessel, and supplying a nitriding agent and a halide of the raw material onto the seed crystal substrate heated to a predetermined crystal growth temperature to grow a crystal of a nitride of the group III element on the seed crystal substrate, and
in the crystal growth process,
a member formed from a material in which at least a surface of the material does not contain quartz and boron is used as a member defining a high-temperature region, at least, of the reaction vessel, the high-temperature region being a region that is heated to the crystal growth temperature and that comes into contact with gas being supplied onto the seed crystal substrate.

\* \* \* \* \*